United States Patent
Hsu

[11] Patent Number: 6,037,228
[45] Date of Patent: Mar. 14, 2000

[54] METHOD OF FABRICATING SELF-ALIGNED CONTACT WINDOW WHICH INCLUDES FORMING A UNDOPED POLYSILICON SPACER THAT EXTENDS INTO A RECESS OF THE GATE STRUCTURE

[75] Inventor: Shih-Ying Hsu, Hsinchu, Taiwan

[73] Assignee: United Microelectronics Corp., Taiwan

[21] Appl. No.: 09/249,501

[22] Filed: Feb. 12, 1999

[51] Int. Cl.[7] .................... H01L 21/8238; H01L 21/336; H01L 21/3206; H01L 29/76; H01L 27/088

[52] U.S. Cl. .................... 438/279; 438/279; 438/593; 438/595; 438/592; 438/303; 438/634; 438/261; 257/382; 257/383; 257/412; 257/900

[58] Field of Search .................... 438/230, 593, 438/595, 592, 303, 279, 634, 261; 257/382, 383, 900, 412

[56] References Cited

U.S. PATENT DOCUMENTS

| | | |
|---|---|---|
| 5,491,100 | 2/1996 | Lee et al. . |
| 5,545,578 | 8/1996 | Park et al. . |
| 5,559,049 | 9/1996 | Cho . |
| 5,897,353 | 4/1999 | Kim et al. . |

*Primary Examiner*—John F. Niebling
*Assistant Examiner*—Ron Pompey
*Attorney, Agent, or Firm*—Blakely Sokoloff Taylor & Zafman

[57] ABSTRACT

A method of fabricating a self-aligned contact window is described. A gate oxide layer, a conductive layer, a first oxide layer and an undoped polysilicon layer are successively formed on a substrate. These layers above are patterned to form a gate structure. A water clean step is performed, producing a recess in the first oxide layer. A second oxide layer is thermally formed on the surface of the gate structure. An undoped polysilicon spacer is formed on the sidewall of the gate structure and a portion of the undoped polysilicon spacer extends into the recess of the first oxide layer. A dielectric layer is formed over the substrate and using the undoped polysilicon spacer as an etching stop, a self-aligned contact window is formed to expose the source/drain region.

15 Claims, 3 Drawing Sheets

METHOD OF FABRICATING SELF-ALIGNED CONTACT WINDOW WHICH INCLUDES FORMING A UNDOPED POLYSILICON SPACER THAT EXTENDS INTO A RECESS OF THE GATE STRUCTURE

BACKGROUND OF THE INVENTION

1. Field of the Invention

The invention relates to a method of fabricating an integrated circuit, and more particularly to a method of fabricating a self-aligned contact (SAC) window.

2. Description of the Related Art

During the fabrication of a self-aligned contact window, the contact window can be defined without limitations imposed by photolithography, so that the distance between the gates is reduced and the device integration is raised. Therefore, self-aligned contact process is widely used in ULSI.

FIG. 1 is a schematic, cross-sectional view of a self-aligned contact window. Referring to FIG. 1, a silicon nitride layer with a thickness of about 1500 angstroms serving as a cap layer 100 is formed on the gate structure 102. A spacer 104 is formed on the sidewall of the gate structure 102 and is made of silicon nitride. A liner oxide layer 106 is formed between the nitride spacer 104, the nitride cap layer 100 and the gate structure 102 and the substrate 112 to insulate therebetween. The main principle of the self-aligned contact process is to use two kinds material having different etching rates, such as silicon oxide and silicon nitride, with an etching selectivity of about 10. Accordingly, when the oxide layer serving as a dielectric layer 110 is etched, the self-aligned contact window 108 is formed due to the nitride spacer 104 and the cap layer 100. which serve as etching stops.

The substrate 112 should be completely exposed to allow the substrate 112 to be electrically connected with the conductive layer 114, therefore the dielectric layer 110 is often over etched in the etching process for SAC. This easily causes the nitride cap layer 100 and spacer 104 to be partially etched. In addition, the liner oxide layer 106 is formed by chemical vapor deposition and results in an incompact structure thereof. The cap layer 100, the spacer 104 and the liner oxide layer 106 are easily attacked by the etchant, which leads to unsuitable contact of the gate structure 102 and the conductive layer 114 deposited in the SAC window 108. As a result, a short occurs therebetween and the performance of the device is decreased.

Moreover, although the attack can be ameliorated by an increased thickness of nitride cap layer 100, the whole height of the gate structure 102 then increases and therefore the etching process for SAC window 108 cannot be smoothly performed.

SUMMARY OF THE INVENTION

As embodied and broadly described herein, the invention is directed towards a method of fabricating a self-aligned contact window. A gate oxide layer, a conductive layer, a first oxide layer and an undoped polysilicon layer are successively formed on a substrate. These layers are patterned to form a gate structure. A wafer cleaning step is performed, resulting in a recess in the first oxide layer. A second oxide layer is thermally formed on the surface of the wafer. A lightly doped source/drain region is formed in the substrate beside the gate structure. An undoped polysilicon spacer is formed on the sidewall of the gate structure and a portion of the undoped polysilicon spacer extends into the recess of the first oxide layer. A heavily doped source/drain region is formed in the substrate beside the undoped polysilicon spacer. A dielectric layer is formed over the substrate and, using the spacer as an etching stop, a self-aligned contact window is formed to expose the source/drain region.

Since the etching selectivity of oxide layer/polysilicon layer is far higher than that of the oxide layer/silicon nitride layer, the polysilicon material is able to protect the gate structure. The thickness of the cap layer on the gate structure is therefore decreased and the etching process can be easily performed. In addition, the cap layer and the spacer are made of undoped polysilicon, which has a good ability to protect the gate structure from being attacked, which prevents shorts.

It is to be understood that both the foregoing general description and the following detailed description are exemplary and explanatory only and are not restrictive of the invention, as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
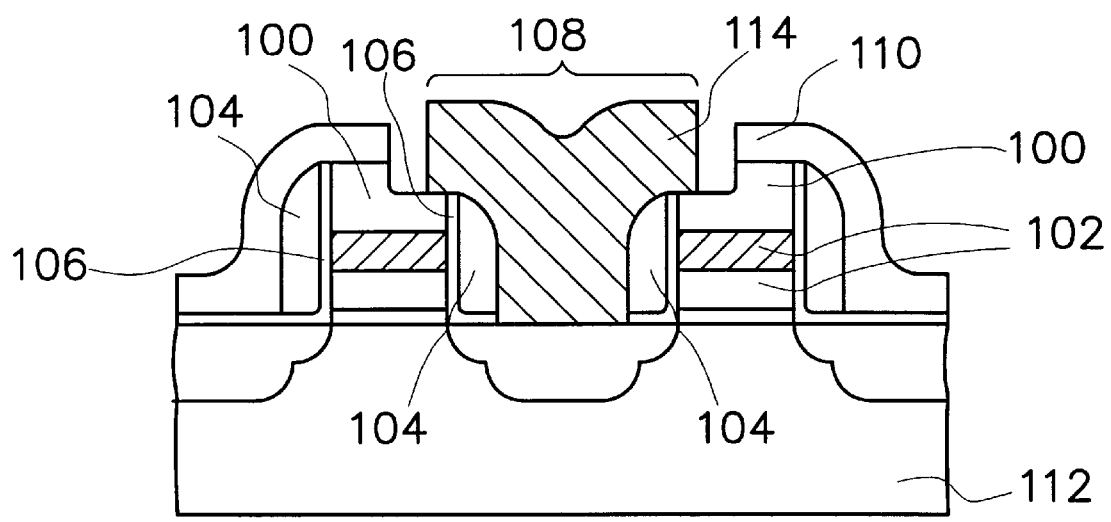
FIG. 1 is a schematic, cross-sectional view of a self-aligned window.

Reference will now be made in detail to the present preferred embodiments of the invention, examples of which are illustrated in the accompanying drawings. Wherever possible, the same reference numbers are used in the drawings and the description to refer to the same or like parts.

A silicon oxide layer and an undoped polysilicon layer are formed on the gate and are used to protect the gate in this invention. The oxide layer, the undoped polysilicon layer and the gate are patterned to form a gate structure, and a wafer cleaning process is performed to form a recess in the oxide layer. A thin oxide layer is formed on the surface of the gate structure by thermal oxidation. An undoped polysilicon spacer is formed on the sidewall of the gate structure. The spacer extends into the recess of the oxide layer and is insulated with the gate structure by the thin oxide layer. Subsequently, a dielectric layer is formed over the substrate. Using the undoped polysilicon layer and polysilicon spacer as an etching stop, the dielectric layer is etched to form a self-aligned contact window and a portion of the substrate is exposed. Since the etching selectivity of the oxide layer/polysilicon layer is higher than that of oxide layer/silicon nitride, the polysilicon material can protect the gate from being attacked by the etchant during etching process. The thin oxide layer is formed by thermal oxidation; therefore its structure is dense and capable of withstanding the etchant. Additionally, the undoped polysilicon spacer extends into the recess of the oxide layer and as a result, a portion of the spacer is above the gate to protect the gate again.

Figure 2A:
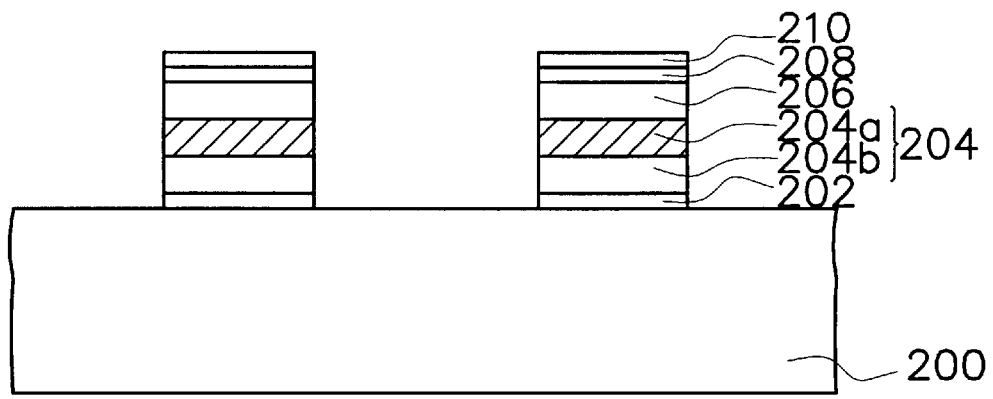
FIGS. 2A–2D are schematic, cross-sectional views illustrating fabrication of self-aligned contact window in a preferred embodiment according to the invention.

FIGS. 2A–2D are schematic, cross-sectional views of the process for fabricating a self-aligned contact window in a preferred embodiment according to the invention. Referring to FIG. 2A. a gate oxide layer 202 is formed on a substrate 200 by thermal oxidation, for example, and its thickness is about 30–100 angstroms. A conductive layer 204 is formed on the gate oxide layer 202 and used as a gate. The conductive layer 204 can be made of polysilicon layer/polycide 204b/204a including polysilicon/tungsten silicide, for example. The method of forming the conductive layer 204 includes chemical vapor deposition (CVD).

Referring to FIG. 2A again, an oxide layer 206, such as TEOS oxide, is formed on the conductive layer 204 by CVD. The thickness of the oxide layer 206 is about 300–700 angstroms, for example. An undoped polysilicon layer 208 with a thickness of about 300–600 angstroms is then formed on the oxide layer 206 by a method such as CVD, and $SiH_4$ is used as a gas source, for example. An anti-reflective coating (ARC) layer 210 is formed on the undoped polysilicon layer 208 and can be a silicon-oxy-nitride with a thickness of about 300–500 angstroms. The ARC layer 210 can avoid reflection during photolithography, which would lead to an alignment error, so that the formation of the ARC layer 210 becomes more and more important as the size of the integrated device is reduced.

The ARC layer 210, the undoped polysilicon layer 208, the oxide layer 206, the conductive layer 204 and the gate oxide layer 202 are patterned by photolithography to form a gate structure, as illustrated in FIG. 2A. As a result, the conductive layer 204 is covered with a undoped polysilicon layer 208, an oxide layer 206 and an ARC layer 210 and the conductive layer 204 is protected by these other layers.

Figure 2B:
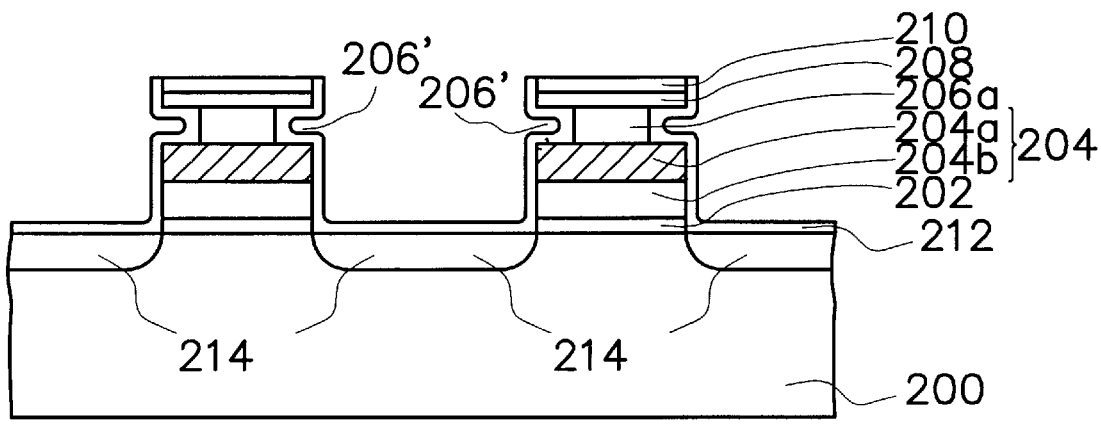

Referring to FIG. 2B, a wafer cleaning, such as wet cleaning, is performed on the substrate 200 in a hydrogen fluoride solution or RCA solution, for example, such that a portion of the oxide layer 206 is eroded. Accordingly, the oxide layer 206 is depressed to produce a recess 206' therein. An oxide layer 212 having a thickness of about 100–150 angstroms is formed on the conductive layer 204, the oxide layer 206a, the undoped polysilicon layer 208 and the ARC layer 210 by thermal oxidation. Since the oxide layer 212 is thermally formed, such that it is firm enough to withstand the attack by the etchant. Additionally, the oxide layer 212 is thinner; therefore the recess 206' of the oxide layer 206a still exists. While using the ARC layer 210 as a mask, an ion implantation is then performed on the substrate 200 to form a lightly doped source/drain region 214 in the substrate beside the gate 204.

Figure 2C:
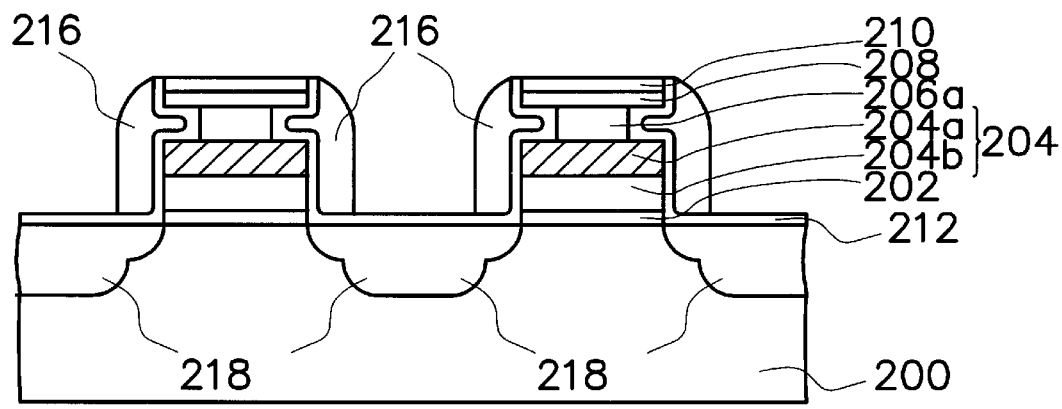

Referring to FIG. 2C, an undoped polysilicon layer is formed over the substrate 200. and then etched back to form a undoped polysilicon spacer 216 on the sidewall of the gate 204 by using the ARC layer 210 and the oxide layer 212 as an etching stop. The spacer 216 extends into the recess 206' (FIG. 2B), such that a part of the spacer 216 locates above the conductive layer 204 to protect the gate 204, again. A heavily doped source/drain region 218 is then formed by implanting ions in the substrate 200.

Figure 2D:
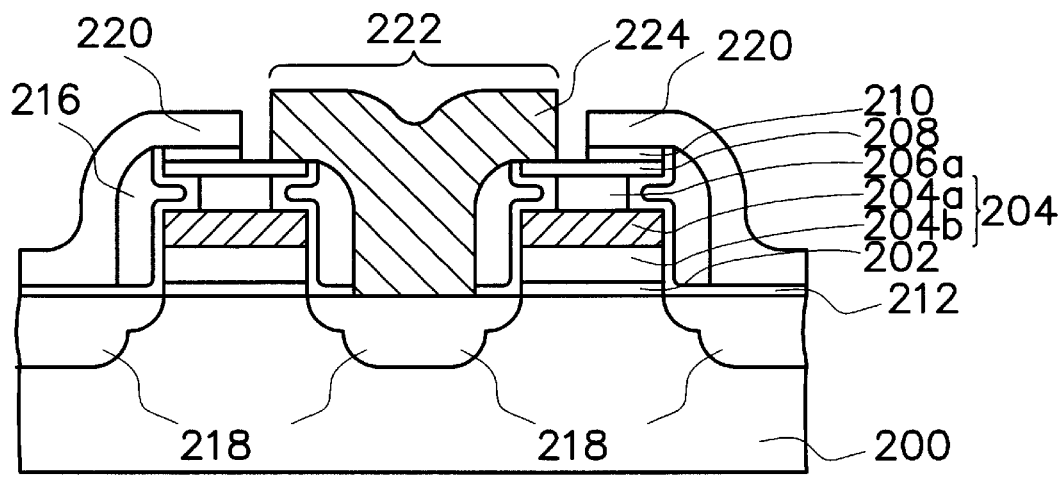

Referring to FIG. 2D, a dielectric layer 220, such as silicon oxide, is formed on the substrate 200 by CVD. The dielectric layer 220 is patterned by a photoresist layer (not shown), and the dielectric layer 220 is etched to form a self-aligned contact window by using the undoped polysilicon layer 208 and undoped polysilicon spacer 216 as an etching stop. The source/drain region 218 is exposed. The dielectric layer 220 is made of silicon oxide, for example. Since the selectivity of silicon oxide/polysilicon can be adjusted of about 40–50, the polysilicon spacer 216 and the polysilicon layer 208 can credibly protect the conductive layer 204 from being attacked by the etchant while etching the dielectric layer 220. In addition, the oxide layer 212 is capable of withstanding the attack of the etchant because it is formed by thermal oxidation. Moreover, the undoped polysilicon spacer 216 extends into the recess 206' of the oxide layer 206a; therefore it also protects the gate 204 while the etching step is performed. Then, a conductive layer 224 is formed in the self-aligned contact window 222 to electrically connect to the source/drain region 218. Accordingly, the short, which is caused by a contact between the conductive layer 224 and the gate 204, can be avoided by the formation of undoped polysilicon layer 208 and the polysilicon spacer 216, to thereby enhance the performance of devices.

Furthermore, the oxide/polysilicon has higher selectivity, thus the thickness of the polysilicon layer 208 is thinner than that of the nitride cap layer in prior art. Accordingly, the difficulty of etching the SAC window can be overcome.

The high selectivity of oxide/undoped polysilicon is used in this invention to protect the gate from being damage by the etchant during the etching process for the SAC window. Additionally, since the undoped polysilicon provides better anti-etching ability for the etchant, therefore the thickness thereof is thinner and as a result, the height of the gate is reduced to allow the etching process to be easily performed.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a self-aligned contact window, comprising:

providing a substrate having a gate oxide layer;

forming a conductive layer, a first oxide layer and a first undoped polysilicon layer on the substrate;

patterning the first undoped polysilicon layer, the first oxide layer and the conductive layer to form a gate structure having a surface;

removing a portion of the first oxide layer to form a recess therein;

forming a second oxide layer on the surface of the gate structure;

forming an undoped polysilicon spacer on the sidewall of the gate structure such that the undoped polysilicon spacer extends into the recess of the first oxide layer;

forming a dielectric layer over the substrate; and forming a self-aligned contact window within the dielectric layer to expose the substrate.

2. The method according to claim 1, wherein the first oxide layer includes TEOS oxide.

3. The method according to claim 2, wherein the TEOS oxide is formed by chemical vapor deposition.

4. The method according to claim 1, wherein a portion of the first oxide layer is removed by wet cleaning.

5. The method according to claim 4, wherein the wet cleaning is performed in a HF solution.

6. The method according to claim 1, wherein the second oxide layer is formed by thermal oxidation.

7. The method according to claim 1, wherein forming the undoped polysilicon spacer further comprises:

forming a second undoped polysilicon layer over the substrate; and etching back the second undoped polysilicon layer to form an undoped polysilicon spacer on the sidewall of the gate structure.

8. The method according to claim 1, wherein forming the self-aligned contact window further comprises using the first undoped polysilicon layer as an etching stop to pattern the dielectric layer.

9. The method according to claim 1, wherein after forming the undoped polysilicon layer further comprises forming an anti-reflectivity coating layer.

10. The method according to claim 9, wherein the anti-reflectivity coating layer includes silicon-oxy-nitride ($SiO_xN_y$).

11. The method according to claim 1, wherein after forming the second oxide layer further comprises forming a lightly doped source/drain region in the substrate beside the gate structure.

12. The method according to claim 1, wherein after forming the polysilicon spacer further comprises forming a heavily doped source/drain region in the substrate beside the undoped polysilicon spacer.

13. The method according to claim 1, wherein the thickness of the first oxide layer is in a range of about 300–700 angstroms.

14. The method according to claim 1, wherein the thickness of the first undoped polysilicon layer is in a range of about 300–600 angstroms.

15. The method according to claim 1, wherein the thickness of the second oxide layer is in a range of about 100–150 angstroms.

* * * * *

UNITED STATES PATENT AND TRADEMARK OFFICE
CERTIFICATE OF CORRECTION

PATENT NO.   : 6,037,228
DATED        : March 14, 2000
INVENTOR(S)  : Hsu

It is certified that error appears in the above-identified patent and that said Letters Patent is hereby corrected as shown below:

Title page, Item [57], line 5, delete "A water clean step" and insert --A wafer clean step--.

Signed and Sealed this

Tenth Day of April, 2001

Attest:

NICHOLAS P. GODICI

Attesting Officer      Acting Director of the United States Patent and Trademark Office